US012604699B2

(12) United States Patent
Yang

(10) Patent No.: US 12,604,699 B2
(45) Date of Patent: Apr. 14, 2026

(54) PROCESSING APPARATUS

(71) Applicant: DISCO CORPORATION, Tokyo (JP)

(72) Inventor: Yunfeng Yang, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 267 days.

(21) Appl. No.: 17/809,323

(22) Filed: Jun. 28, 2022

(65) Prior Publication Data

US 2023/0027338 A1     Jan. 26, 2023

(30) Foreign Application Priority Data

Jul. 20, 2021     (JP) ................................. 2021-119765

(51) Int. Cl.
  *B26D 7/18*       (2006.01)
  *H10P 72/00*      (2026.01)
(52) U.S. Cl.
  CPC ............ *H10P 72/0428* (2026.01); *B26D 7/18* (2013.01); *B26D 7/1845* (2013.01)
(58) Field of Classification Search
  CPC ........... H01L 21/6838; H01L 21/67092; H01L 21/304; H01L 21/683; B26D 7/18; B26D 7/1845; Y02P 70/10
  USPC ......................................................... 83/168
  See application file for complete search history.

(56) References Cited

FOREIGN PATENT DOCUMENTS

| CN | 106206374 | A | * | 12/2016 | ............. B24B 37/04 |
|----|-----------|---|---|---------|------------------------|
| CN | 108296935 | A | * | 7/2018 | ............. B24B 19/00 |
| JP | 2010177376 | A | | 8/2010 | |
| JP | 2014091206 | A | * | 5/2014 | ............. B23Q 3/08 |
| JP | 2016221668 | A | | 12/2016 | |
| JP | 2020136500 | A | * | 8/2020 | .......... H10P 72/7624 |
| WO | WO-2006064851 | A1 | * | 6/2006 | ........ G03F 7/70341 |
| WO | WO-2021201108 | A1 | * | 10/2021 | ....... H01L 21/67248 |

OTHER PUBLICATIONS

Translation CN-106206374A (Year: 2024).*
Translation, WO-2006064851-A1 (Year: 2025).*
Translation, CN-108296935-A (Year: 2026).*
Office Action issued in counterpart Japanese patent application No. 2021-119765, dated Jun. 17, 2025.

* cited by examiner

*Primary Examiner* — Nhat Chieu Q Do
(74) *Attorney, Agent, or Firm* — GREER BURNS & CRAIN, LTD.

(57)     ABSTRACT
A processing apparatus includes a holding table including a holding surface that holds a back surface side of a substrate and a processing unit that processes the substrate held on the holding surface. The holding surface includes a holding section that holds a central region of the substrate, a discharge groove that surrounds the holding section, and an outer circumferential groove that surrounds the discharge groove and communicates with a suction source to hold under suction the substrate. The processing apparatus uses the discharge groove to collect processing swarf produced by the processing unit.

15 Claims, 5 Drawing Sheets

PROCESSING APPARATUS

CROSS-REFERENCE TO RELATED APPLICATIONS

This application claims priority to Japanese Patent Application No. 2021-119765, filed on Jul. 20, 2021.

BACKGROUND OF THE INVENTION

Field of the Invention

The present invention relates to a processing apparatus that includes a holding table configured to hold a substrate.

Description of the Related Art

Processing a substrate in a state in which the substrate is held on a holding table involves the risk of contaminating a back surface side of the substrate held on the holding table or a holding surface of the holding table holding the substrate, due to processing swarf or water containing the processing swarf finding its way toward the back surface side or the holding surface and adhering thereto. In light of this, Japanese Patent Laid-open No. 2010-177376 discloses a cleaning apparatus including a groove section and a communication channel. The groove section has a diameter smaller than the diameter of a wafer and is formed in a ring shape on an upper surface of a holding section in such a manner as to surround a holding surface. The communication channel is formed on the holding section such that one end communicates with the groove section and the other end is open to air.

SUMMARY OF THE INVENTION

In the related art, when a portion that is part of an outer circumferential portion of a substrate and that projects outward from a holding surface is not attracted under suction to the holding surface and flapping occurs during the processing of the substrate, processing swarf could sneak into a back surface of the substrate, possibly deteriorating the processing quality. As such, there has been a demand for improved processing quality in the related art.

It is accordingly an object of the present invention to provide a processing apparatus that is capable of maintaining high processing quality while preventing processing swarf from sneaking into the back surface of the substrate.

In accordance with an aspect of the present invention, there is provided a processing apparatus including a holding table and a processing unit. The holding table includes a holding surface that holds a back surface side of the substrate, and the processing unit processes the substrate held on the holding surface. The holding surface includes a holding section that holds a central region of the substrate, a discharge groove that surrounds the holding section, and an outer circumferential groove that surrounds the discharge groove and communicates with a suction source to hold under suction the substrate, and processing swarf produced by the processing unit is collected by the discharge groove.

Preferably, the processing apparatus further includes a liquid supply unit that supplies liquid to the substrate, and the discharge groove collects the liquid containing the processing swarf.

Preferably, the holding surface is formed smaller than the substrate, and the processing unit includes a cutting blade that is held in a rotatable manner by a spindle. The processing apparatus removes the outer circumferential portion that is part of the substrate and that is exposed from the holding surface, by moving the holding table and the cutting blade relative to each other while positioning the cutting blade on the outer circumferential portion of the substrate and supplying to the substrate cutting water that is the liquid.

The processing apparatus according to the present invention produces such an effect of maintaining high processing quality while preventing processing swarf from sneaking into the back surface of the substrate.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by the contents described in the following embodiment. In addition, the constituent elements described below include those that can easily be conceived of by those skilled in the art and those that are substantially identical. Moreover, the configurations described below can be combined as appropriate. Furthermore, the configuration can be omitted, replaced, or modified in various ways within a scope not departing from the gist of the present invention.

In the embodiment described below, an XYZ orthogonal coordinate system is set, and is used as a reference to describe the positional relations between components. One direction on a horizontal plane is an X-axis direction, a direction orthogonal to the X-axis direction on the horizontal pane is a Y-axis direction, and a direction perpendicular to both the X-axis direction and the Y-axis direction is a Z-axis direction. An XY plane including the X-axis and the Y-axis is parallel to the horizontal plane. The Z-axis direction perpendicular to the XY plane is a vertical direction.

Figure 1:
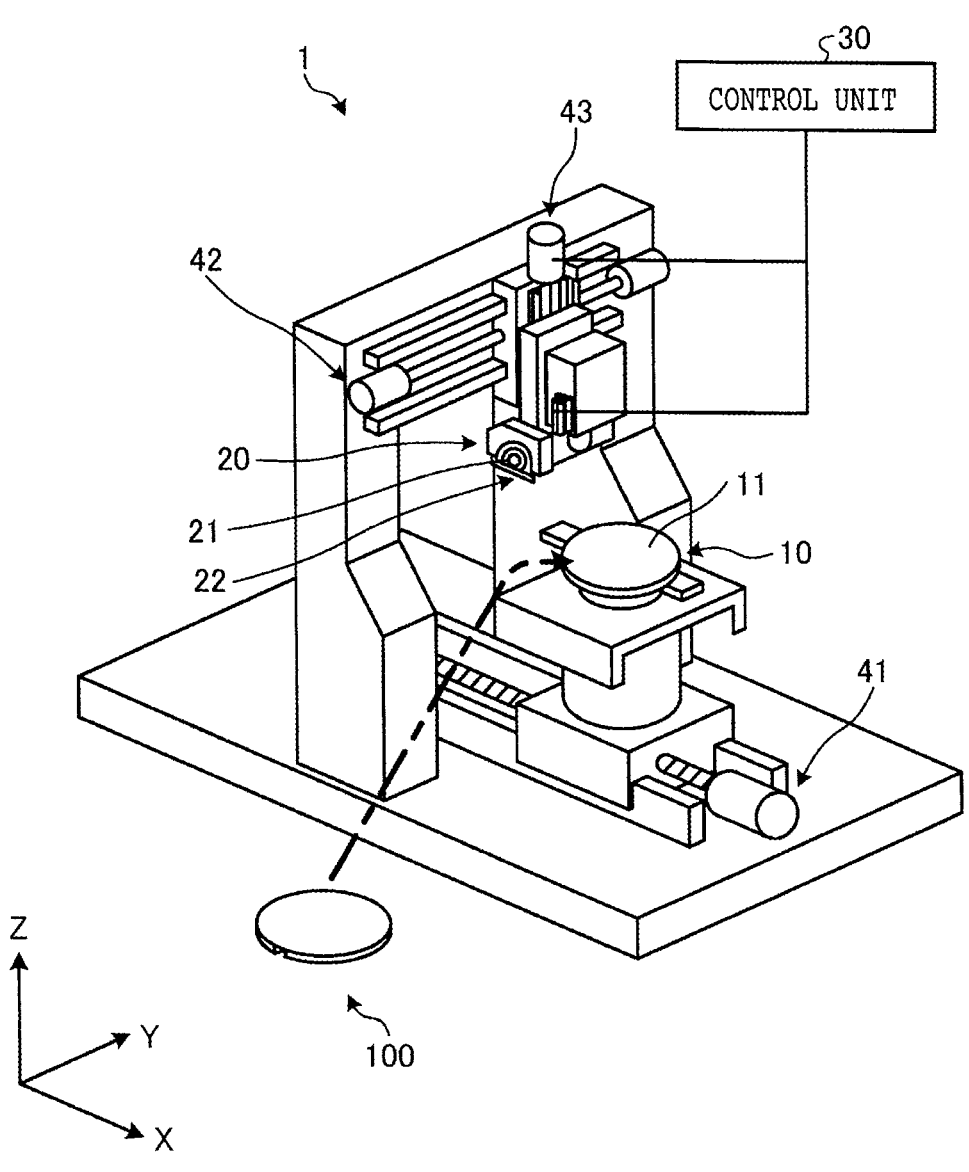
FIG. 1 is a perspective view illustrating a configuration example of a processing apparatus according to an embodiment of the present invention.
Figure 2:
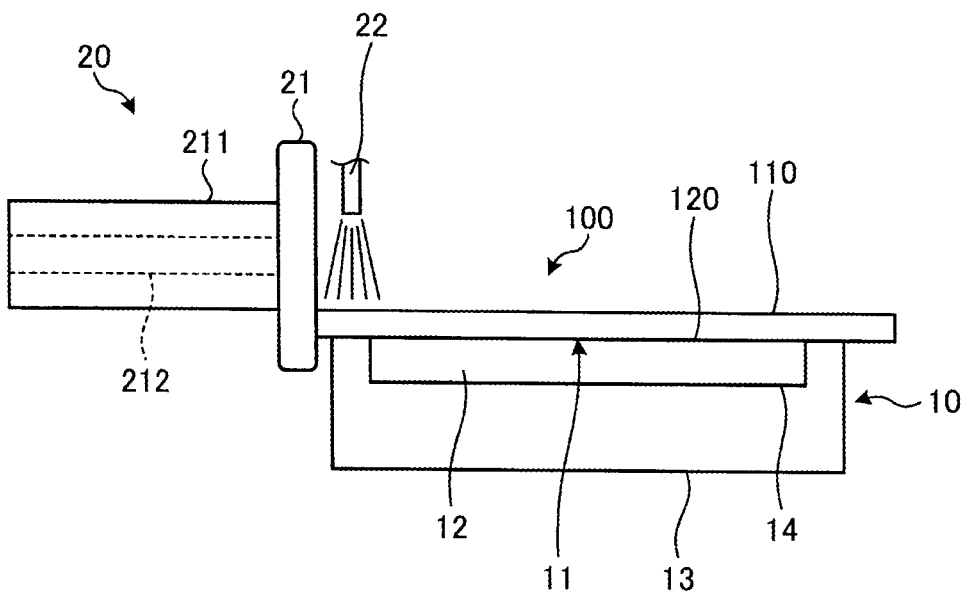
FIG. 2 is a schematic view for describing a relation between a cutting blade and a holding table that are illustrated in FIG. 1.

A processing apparatus according to an embodiment of the present invention will be described in reference to the drawings. FIG. 1 is a perspective view illustrating a configuration example of the processing apparatus according to the embodiment. FIG. 2 is a schematic view for describing a relation between a cutting blade and a holding table that are illustrated in FIG. 1.

As illustrated in FIG. 1, the processing apparatus according to the embodiment that is denoted by 1 is an apparatus configured to perform any processing on a substrate 100 which is a processing target. In other words, the processing apparatus 1 is, for example, a processing apparatus configured to process the substrate 100. The substrate 100 includes, for example, a semiconductor wafer or an optical device wafer formed in a circular shape and made of silicon, sapphire, gallium arsenide, or the like.

In the example illustrated in FIG. 1, the processing apparatus 1 is a processing apparatus that cuts the substrate 100. The processing apparatus 1 includes a holding table 10, a processing unit 20, and a control unit 30. The control unit 30 is electrically connected to the holding table 10 and the processing unit 20.

The holding table 10 includes a holding surface 11 that holds the substrate 100. The holding surface 11 holds a back surface 120 side of the substrate 100. The holding table 10 communicates with an unillustrated suction source and holds under suction the substrate 100 by the negative pressure supplied from the suction source. The holding table 10 is movable along the X-axis direction by an X-axis moving mechanism 41 to be described later and is rotatable about the Z-axis by an unillustrated rotation drive mechanism. The holding table 10 is, for example, a chuck table. The holding table 10 has disposed thereon multiple (two in the present embodiment) clamps that clamp the substrate 100. The X-axis moving mechanism 41 includes, for example, a ball screw, a pulse motor, and the like.

In the example illustrated in FIG. 2, the holding table 10 includes a holding section 12 that holds the substrate 100 and a frame body 13 that surrounds the holding section 12. The holding section 12 is a suction plate formed in a disk-shape. The holding section 12 includes, for example, a porous holding member or the like, and has an upper surface constituting part of the holding surface 11 that holds the substrate 100. The holding section 12 includes, for example, a porous plate or the like. The holding section 12 holds the substrate 100 in a state in which the holding section 12 is in contact with the back surface 120 of the substrate 100.

The frame body 13 has a recessed section 14 formed in the central portion of the frame body 13. The recessed section 14 has an inside diameter larger than an outside diameter of the holding section 12. The recessed section 14 has formed therein a suction channel by which the holding section 12 communicates with an unillustrated suction source. The holding table 10 can be used with the holding section 12 fitted into the recessed section 14 of the frame body 13.

The holding surface 11 of the holding table 10 includes the holding section 12 and an upper surface (surface) that is continuous from the holding section 12 to the frame body 13. The holding surface 11 is formed smaller than the substrate 100. In other words, the frame body 13 has an outside diameter smaller than the diameter of the substrate 100. Accordingly, the holding table 10 has such a configuration that the holding table 10 can hold under suction the substrate 100 in a state in which an outer circumferential portion of the substrate 100 projects outward from the holding surface 11. Note that the holding table 10 may hold a substrate smaller than the holding surface 11 or a substrate that has the same size as the holding surface 11.

The processing unit 20 processes the substrate 100 held on the holding table 10. Specifically, the processing unit 20 is an example of a processing unit that processes the substrate 100 held on the holding table 10. The processing unit 20 includes, for example, a cutting blade 21 that cuts the substrate 100 held on the holding surface 11 of the holding table 10. The cutting blade 21 is a ring-shaped, extremely thin blade that rotates. The cutting blade 21 is held in a rotatable manner by a spindle 212 in a housing 211. The spindle 212 is rotationally driven by an unillustrated motor housed in the housing 211. The cutting blade 21 is mounted on a distal end portion of the spindle 212 in a detachable manner, and rotates by rotational driving of the spindle 212.

As illustrated in FIG. 1, the processing unit 20 is movable along the Y-axis direction by a Y-axis moving mechanism 42, and also along the Z-axis direction by a Z-axis moving mechanism 43. The Y-axis moving mechanism 42 moves the processing unit 20 relative to the holding surface 11 of the holding table 10 in the Y-axis direction. The Y-axis moving mechanism 42 and the Z-axis moving mechanism 43 include, for example, a ball screw, a nut, a pulse motor, and the like.

As illustrated in FIG. 2, the processing unit 20 includes a nozzle 22 that supplies liquid to the substrate 100 held on the holding surface 11. The liquid includes, for example, cleaning water used for cleaning the substrate 100 and the like. The nozzle 22 supplies from an upper side liquid to an upper surface 110 of the substrate 100 held on the holding surface 11. The nozzle 22 is, for example, configured to be capable of supplying liquid to that portion of the substrate 100 which is to be cut by the cutting blade 21. The nozzle 22 is, for example, disposed near the cutting blade 21, and supplies liquid under the control of the control unit 30. In the present embodiment, the nozzle 22 is an example of the liquid supply unit and is included in the processing apparatus 1.

The control unit 30 includes an arithmetic processing unit such as a central processing unit (CPU), a storage unit such as a read only memory (ROM) or a random access memory (RAM), and an input/output interface unit. The control unit 30 is a computer that is capable of executing programs for controlling the above-mentioned constituent elements in line with the series of processing steps to be implemented by the processing apparatus 1, with use of the above-mentioned units.

The control unit 30 controls the mechanisms (X-axis moving mechanism 41, Y-axis moving mechanism 42, and Z-axis moving mechanism 43) that drive the processing apparatus 1, the processing unit 20, and the like. The control unit 30 controls the components of the processing apparatus 1 and implements the processing process to be performed by the processing apparatus 1. The control unit 30 executes, for example, programs to control the components of the processing apparatus 1 including the holding table 10 and the processing unit 20 and thereby implements processing of the substrate 100. The control unit 30 controls the processing unit 20 to execute the process of cutting the substrate 100 with use of liquid in a state in which the substrate 100 is held on the holding surface 11 of the holding table 10. The control unit 30 performs the process of removing an outer circumferential portion that is part of the substrate 100 and that is exposed from the holding surface 11, by moving the holding table 10 and the cutting blade 21 relative to each other while positioning the cutting blade 21 on the outer circumferential portion of the substrate 100 and supplying to the substrate 100 cutting water that is the liquid.

The processing apparatus 1 controls the processing position of the substrate 100 held on the holding table 10, by moving the holding table 10 and the processing unit 20 relative to each other by the X-axis moving mechanism 41, the Y-axis moving mechanism 42, and the Z-axis moving mechanism 43. The processing apparatus 1 cuts the substrate 100 by the cutting blade 21 while supplying liquid to the part to be cut, in a state in which the substrate 100 is held on the holding surface 11 of the holding table 10.

Note that the processing unit 20 included in the processing apparatus 1 is not limited to the cutting unit that performs cutting processing on the substrate 100 by the cutting blade. For example, the processing unit 20 may be a grinding unit that performs grinding processing on a similar substrate 100 by grinding stones or the like, a polishing unit that performs polishing processing on a similar substrate 100 by a polishing pad or the like, a laser processing unit that performs laser processing on a similar substrate 100 by applying laser beam, or the like.

(Configuration Example of Holding Table)

Figure 3:
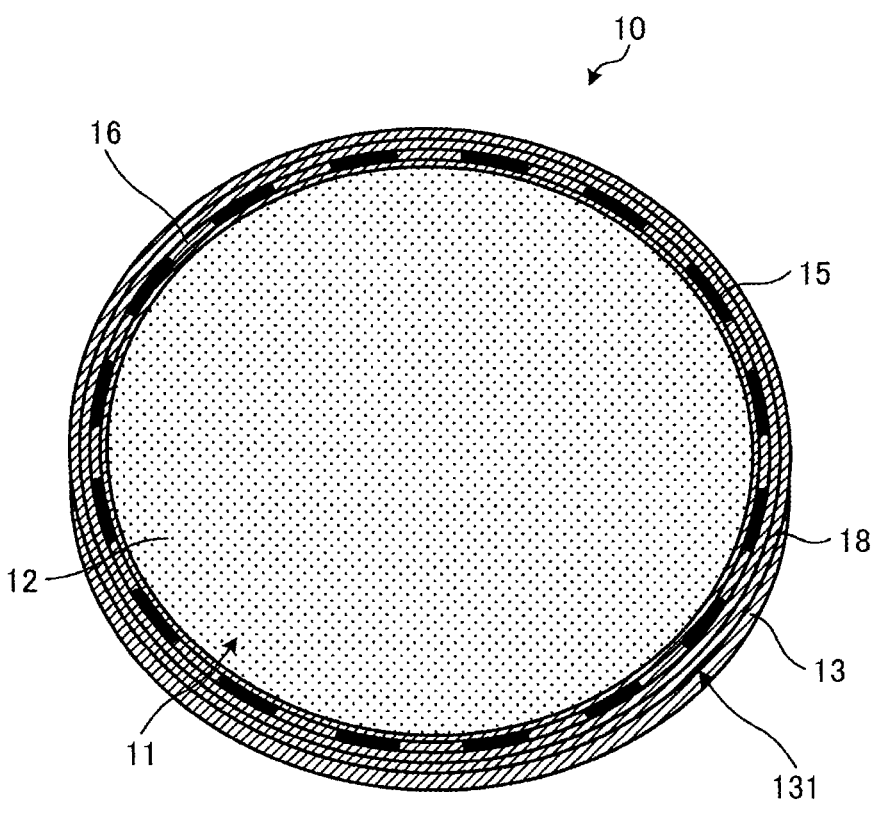
FIG. 3 is a top view illustrating an example of a holding surface of a holding table illustrated in FIG. 1.
Figure 4:
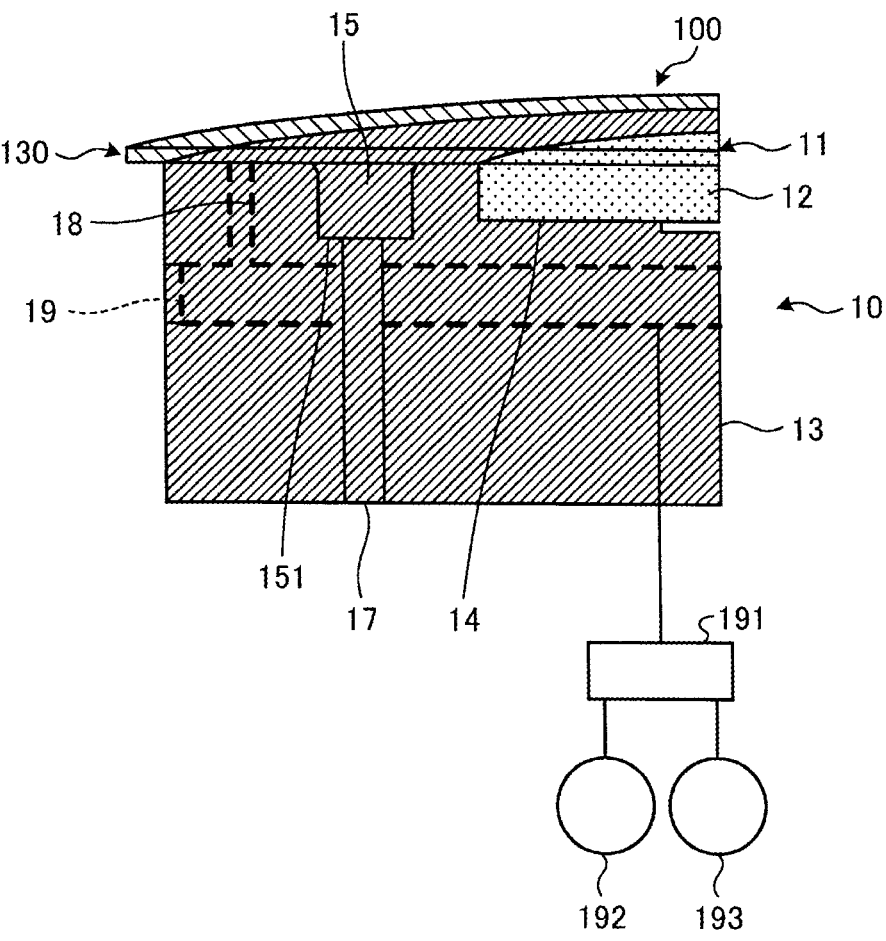
FIG. 4 is a schematic cross sectional view illustrating part of a configuration of the holding table illustrated in FIG. 1.

A configuration example regarding the holding surface 11 of the holding table 10 according to the embodiment will be described. FIG. 3 is a top view illustrating an example of the holding surface 11 of the holding table 10 illustrated in FIG. 1. FIG. 4 is a schematic cross sectional view illustrating part of a configuration of the holding table 10 illustrated in FIG. 1.

For example, in performing full cut trimming on the substrate 100, the processing apparatus 1 performs a process of removing the outer circumferential portion of the substrate 100. In the processing apparatus 1, the holding surface 11 of the holding table 10 is formed smaller than the substrate 100 such that the cutting blade 21 does not collide with the holding table 10. Full cut trimming is a process of removing unnecessary parts of the substrate 100 in a state in which the outer circumferential portion of the substrate 100 projects from the holding surface 11 and is not held on the holding table 10. In the case where the processing apparatus 1 performs full cut trimming, the cutting water containing cutting swarf may sneak into the holding surface 11 from an outer periphery of the substrate 100, and cutting swarf may be sucked by the holding section 12. Further, the processing apparatus 1 may be contaminated due to the cutting swarf being adhered to the back surface 120 of the substrate 100 held on the holding table 10. Hence, the processing apparatus 1 according to the present embodiment maintains high processing quality while preventing cutting swarf and liquid containing cutting swarf from sneaking into the back surface 120 of the substrate 100.

As in the present embodiment, the processing apparatus 1 produces greater advantageous effects in a case in which the processing apparatus 1 processes the substrate 100 while supplying cutting water, since, in such a case, processing swarf is more likely to sneak into the back surface 120 of the substrate 100 held on the holding table 10 due to the liquid containing the processing swarf. Yet, the processing using no liquid also involves the risk of contaminating the processing apparatus 1 due to processing swarf being produced and adhered to the back surface 120 of the substrate 100 held on the holding table 10. Accordingly, the processing apparatus 1 is also effective for processing using no liquid.

As illustrated in FIG. 3, the holding surface 11 of the holding table 10 includes the holding section 12 described above, multiple discharge grooves 15, and an outer circumferential groove 18. The holding section 12 holds a central region of the substrate 100. The central region of the substrate 100 is, for example, a region on the back surface 120 side of the substrate 100 including the center of the disk-shaped substrate 100 and portions around the center.

In the holding surface 11, the multiple discharge grooves 15 are formed on a surface (upper surface) of the frame body 13 between an outer circumference of the holding section 12 and the outer circumferential groove 18. The multiple discharge grooves 15 are disposed at predetermined intervals along the outer circumference of the holding section 12. The discharge grooves 15 allow the cutting water that has flown into a portion between the substrate 100 and the holding surface 11 to flow inside the discharge grooves 15 without heading toward the holding surface 11 and to be discharged outside the frame body 13.

As illustrated in FIG. 4, the discharge groove 15 is formed to have a recessed shape in cross section to allow cutting swarf contained in the cutting water to enter the discharge groove 15. A bottom portion 151 of the discharge groove 15 communicates with a discharge channel 17. In the example illustrated in FIG. 4, the discharge groove 15 has a square shape in cross section, but may instead have other shapes such as an ellipse or a tapered shape in cross section, for example. The discharge channel 17 has one end that communicates with part of the discharge groove 15 and another end that communicates with an unillustrated discharge port of the frame body 13. Accordingly, adopted is such a configuration in which cutting water that has flown into the discharge groove 15 flows into the discharge channel 17 due to gravity or attraction caused by suction when the discharge groove 15 is connected to a suction source and is then discharged outside the frame body 13 from the discharge channel 17.

As illustrated in FIG. 3, the holding surface 11 has a coupling section 16 between adjacent discharge grooves 15 on an upper surface 131 of the frame body 13. The holding surface 11 has multiple discharge grooves 15 and coupling sections 16 disposed in an alternate manner along the outer circumference of the holding section 12. In the holding surface 11, providing the multiple discharge grooves 15 and coupling sections 16 allows the strength of the frame body 13 to be maintained even when a width of the discharge groove 15 is increased in a radial direction. Further, in the holding surface 11, providing the coupling section 16 allows, for example, a suction channel 19 that communicates with the outer circumferential groove 18, which is to be described later, to be formed inside the frame body 13 in which the coupling section 16 is formed.

The outer circumferential groove 18 surrounds the multiple discharge grooves 15 and communicates with a suction source to hold under suction the substrate 100. The outer circumferential groove 18 is formed on the frame body 13, as an annular groove disposed over the entire outer circumferential region of the frame body 13. The outer circumferential groove 18 is formed on the surface (upper surface) of the frame body 13 between multiple discharge grooves 15 and an outer edge of the frame body 13, as an annular groove having a diameter greater than the diameter of the substrate 100. The outer circumferential groove 18 may not have an annular shape and may instead be formed non-continuously in plural number at intervals.

As illustrated in FIG. 4, the outer circumferential groove 18 communicates with the suction channel 19 formed inside the frame body 13. The suction channel 19 is configured to be capable of switching connection with a suction source 192 and an air supply source 193 by an electromagnetic valve 193. In a case where the suction channel 19 is connected to the suction source 192 under the control of the control unit 30, the outer circumferential groove 18 holds under suction the substrate 100 by the negative pressure supplied from the suction source 192. In a case where the suction channel 19 is connected to the air supply source 193 under the control of the control unit 30, the outer circumferential groove 18 is supplied with pressurized air from the air supply source 193 and thus allows air to blow outside the frame body 13 to make it easier to convey out the substrate 100. The suction channel 19 communicates with the holding section 12 and supplies negative pressure to the holding section 12 from the suction source 192.

7

Figure 5:
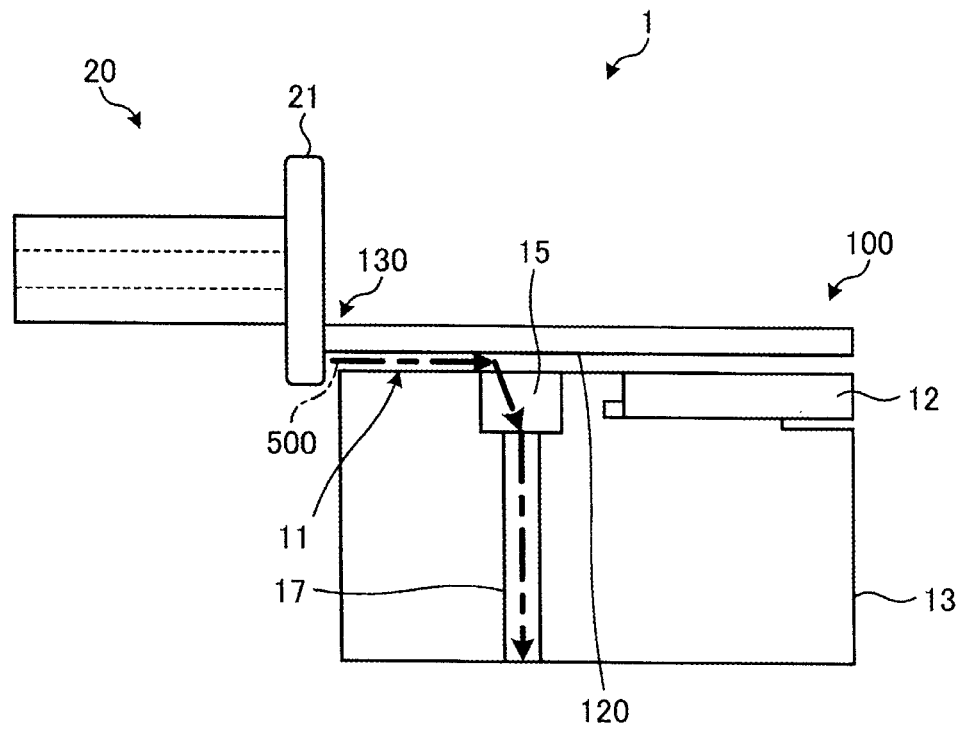
FIG. 5 is a schematic view illustrating an example of discharge operation performed by the processing apparatus according to the embodiment of the present invention.

FIG. 5 is a schematic view illustrating an example of discharge operation performed by the processing apparatus 1 according to the embodiment. As illustrated in FIG. 5, in the processing apparatus 1, the holding section 12 of the holding table 10 holds under suction the central region of the substrate 100, and the outer circumferential groove 18 holds under suction the substrate 100 in the vicinity of the outer circumference of the frame body 13. Accordingly, since the holding table 10 holds under suction the substrate 100 by the holding section 12 and the outer circumferential groove 18, the processing apparatus 1 can prevent the outer circumferential portion, denoted by 130, of the substrate 100 from floating from the holding surface 11 and flapping during processing.

The processing apparatus 1 removes the outer circumferential portion 130 of the substrate 100 by moving the holding table 10 and the cutting blade 21 relative to each other while supplying to the substrate 100 cutting water 500 that is the liquid in a state in which the substrate 100 is held under suction on the holding table 10. In this case, when the cutting water 500 sneaks into the back surface 120 of the substrate 100 from the outer circumferential portion 130 toward the central region of the holding section 12 through a gap between the substrate 100 being processed and the holding table 10, the cutting water 500 is collected by the discharge groove 15 and then discharged to the outside of the frame body 13 from the discharge channel 17. Accordingly, since the cutting water 500 is collected by the discharge groove 15 in the processing apparatus 1, the central region of the substrate 100 and the center of the holding surface 11 that are located on an inner side than the discharge grooves 15 can be prevented from being contaminated.

As described above, the processing apparatus 1 is capable of maintaining high processing quality while preventing cutting water 500 from sneaking into the back surface 120 of the substrate 100. In addition, in the full cut trimming in which the processing apparatus 1 has the holding surface 11 which is smaller than the substrate 100 and the outer circumferential portion 130 of the substrate 100 is exposed from the holding surface 11 and then removed, processing is performed with the cutting blade 21 positioned next to an outer circumferential portion of the holding surface 11, so that the cutting water 500 that is to be used for processing is more likely to sneak into the back surface 120 side of the substrate 100 from a side surface of the holding surface 11 than in the processing performed in the related art where the cutting blade is positioned above the holding surface. Accordingly, the processing apparatus 1 according to the embodiment can be used effectively in full cut trimming.

The processing apparatus 1 according to the embodiment has been described by taking as an example a case where the processing apparatus 1 is a cutting apparatus that cuts the substrate 100. However, the processing apparatus 1 according to the embodiment is not limited to the above-mentioned embodiment and can be implemented by being modified in various ways within a scope not departing from the gist of the present invention. For example, the processing apparatus 1 may be a grinding apparatus or a laser processing apparatus other than the cutting apparatus.

In the processing apparatus 1 according to the embodiment, the discharge grooves 15 are formed in such a manner that multiple through grooves are formed independently, but the discharge groove 15 may instead be formed as a ring-shaped groove. In that case, the coupling section 16 that includes a flow channel that sucks/supplies air to the outer circumferential groove 18 would not be provided; the processing apparatus 1 is only required to separately form inside the frame body 13 a flow channel that communicates with the outer circumferential groove 18.

In the processing apparatus 1 according to the embodiment, the holding section 12 that holds the central region of the substrate 100 may be a porous plate or a plate shaped object made of stainless steel (SUS) having a suction groove that communicates with a suction channel. While the holding section 12 with a suction groove formed therein can easily have the cutting swarf left in the groove removed by being cleaned, the holding section 12 formed of a porous plate would have lower suction force due to cutting swarf being stuck in pores. Hence, the processing apparatus 1 according to the embodiment is especially effective in a case where the processing apparatus 1 has a holding section 12 formed of a porous plate.

The processing apparatus 1 according to the embodiment has been explained by taking as an example a case in which the control unit 30 cooperates with the processing unit 20 to implement a processing unit. However, the processing apparatus 1 according to the present invention is not limited to this. For example, the processing apparatus 1 may implement the processing unit 20 and the control unit 30 as one processing unit.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
a holding table including a holding surface that holds a back surface side of a substrate, wherein the holding table includes a frame body with a recess formed therein; and
a processing unit that processes the substrate held on the holding surface, wherein:
the holding surface includes:
a holding section, including a porous holding member, that holds a central region of the substrate, wherein the porous holding member comprises a plate that is seated within the recess formed in the frame body,
a plurality of arcuate discharge grooves that are arranged in an annular manner to surround the porous holding member, wherein adjacent ones of the plurality of arcuate discharge grooves are each separated by a coupling section that defines a portion of the holding surface of the holding table,
an outer circumferential groove that surrounds the arcuate discharge grooves and communicates with a suction source to hold under suction the substrate, wherein the plurality of arcuate discharge grooves and the outer circumferential groove are both formed in the frame body, and
a suction channel provided in at least one of the coupling sections, wherein the suction channel communicates a suction force from the suction source to the outer circumferential groove, and
wherein processing swarf produced by the processing unit is collected by the plurality of arcuate discharge grooves, and
wherein the holding surface includes both an upper surface of the porous holding member and an upper surface of the frame body, and
wherein the processing apparatus further comprises:
a liquid supply unit that supplies liquid to the substrate, and wherein the arcuate discharge grooves collect the liquid containing the processing swarf.

2. The processing apparatus according to claim 1, wherein the holding surface is formed smaller than the substrate, and further wherein an outer peripheral portion of the substrate is not in contact with any portion of the holding table when the back surface of the substrate is being held by the holding surface of the holding table.

3. The processing apparatus according to claim 1, wherein the plurality of arcuate discharge grooves comprise at least three arcuate discharge grooves.

4. The processing apparatus according to claim 1, wherein the plurality of arcuate discharge grooves comprise at least five arcuate discharge grooves.

5. The processing apparatus according to claim 1, wherein the plurality of arcuate discharge grooves comprise at least ten arcuate discharge grooves.

6. The processing apparatus according to claim 1, wherein the plate comprises a disc-shaped plate.

7. The processing apparatus according to claim 1, wherein the porous holding member extends from a central point to an inner peripheral surface of a frame body.

8. The processing apparatus according to claim 1, wherein:
the frame body supports the porous holding member within the recess.

9. A processing apparatus comprising:
a holding table including a holding surface that holds a back surface side of a substrate, wherein the holding table includes a frame body with a recess formed therein;
a processing unit that processes the substrate held on the holding surface; and
a liquid supply unit that supplies liquid to the substrate, wherein the holding surface includes:
a holding section, including a porous holding member, that holds a central region of the substrate, wherein the porous holding member is seated within the recess of the frame body,
a discharge groove that surrounds the porous holding member, and
an outer circumferential groove that surrounds the discharge groove and that is configured and arranged to hold the substrate under suction, wherein the plurality of discharge grooves and the outer circumferential groove are both formed in the frame body, and
wherein:
processing swarf produced by the processing unit is collected by the discharge groove,
the discharge groove is connected to a suction source,
the holding surface is formed smaller than the substrate, and further wherein an outer peripheral portion of the substrate is not in contact with any portion of the holding table when the back surface of the substrate is being held by the holding surface of the holding table, and still further wherein the holding surface includes both an upper surface of the porous holding member and an upper surface of the frame body,
the processing unit includes a cutting blade held in a rotatable manner by a spindle, and
the processing apparatus removes an outer circumferential portion that is part of the substrate and that is exposed from the holding surface, by moving the holding table and the cutting blade relative to each other while positioning the cutting blade on the outer circumferential portion of the substrate and supplying to the substrate cutting water that is the liquid.

10. The processing apparatus according to claim 9, wherein the porous holding member comprises a disc-shaped plate that is seated within the recess formed in the frame body.

11. The processing apparatus according to claim 9, wherein the porous holding member extends from a central point to an inner peripheral surface of a frame body.

12. The processing apparatus according to claim 9, wherein:
the porous holding member is seated within the recess of the frame body and the porous holding member extends from a central point to an inner peripheral surface of the recess of the frame body.

13. The processing apparatus according to claim 9, wherein:
the porous holding member is seated within the recess of the frame body.

14. The processing apparatus according to claim 9, wherein:
the frame body supports the porous holding member.

15. A method of processing a substrate on a processing apparatus that includes a holding table including a holding surface configured for holding a back surface side of the substrate, wherein the holding table includes a frame body with a recess formed therein; a processing unit that processes the substrate held on the holding surface; and a liquid supply unit that supplies liquid to the substrate, wherein the holding surface includes: a holding section, including a porous holding member, that holds a central region of the substrate, wherein the porous holding member is seated within the recess of the frame body; a plurality of discharge grooves that surround the porous holding member and that are connected to a suction source, wherein adjacent ones of the plurality of discharge grooves are each separated by a coupling section that defines a portion of the holding surface of the holding table; an outer circumferential groove that surrounds the discharge grooves and communicates with a suction source to hold under suction the substrate, wherein the plurality of discharge grooves and the outer circumferential groove are both formed in the frame body; and a suction channel provided in at least one of the coupling sections, wherein the suction channel communicates a suction force from the suction source to the outer circumferential groove; and the holding surface is formed smaller than the substrate, wherein the holding surface includes both an upper surface of the porous holding member and an upper surface of the frame body, wherein the plurality of discharge grooves collect the liquid containing processing swarf, and wherein the processing unit includes a cutting blade held in a rotatable manner by a spindle, wherein the method comprises:
positioning the substrate on the holding surface of the holding table such that an outer peripheral portion of the substrate is not in contact with any portion of the holding table when the back surface of the substrate is being held by the holding surface of the holding table; and
removing an outer circumferential portion that is part of the substrate and that is exposed from the holding surface, by moving the holding table and the cutting blade relative to each other while positioning the cutting blade on the outer circumferential portion of the substrate and supplying to the substrate cutting water that is the liquid.

* * * * *